United States Patent [19]

Kawai et al.

[11] Patent Number: 4,953,128
[45] Date of Patent: Aug. 28, 1990

[54] VARIABLE DELAY CIRCUIT FOR DELAYING INPUT DATA

[75] Inventors: Hiroyuki Kawai; Masahiko Yoshimoto, both of Hyogo, Japan

[73] Assignee: Mitsubishi Denki Kabushiki Kaisha, Tokyo, Japan

[21] Appl. No.: 133,790

[22] Filed: Dec. 16, 1987

[30] Foreign Application Priority Data

Dec. 16, 1986 [JP] Japan .................. 61-300382

[51] Int. Cl.$^5$ ................................ G11C 7/00
[52] U.S. Cl. .................. 365/194; 365/189.12; 365/230.06; 365/236
[58] Field of Search .............. 365/230.06, 76, 220, 365/236, 240, 189.12, 194

[56] References Cited

U.S. PATENT DOCUMENTS 4,633,441 12/1986 Ishimoto ...................... 365/236

FOREIGN PATENT DOCUMENTS 2013379A 8/1979 United Kingdom .

OTHER PUBLICATIONS

Tietze, Schenk: Halbleiter-Schaltungstechnik, revised reprint of the 3rd edition, Springer-Verlag, 1976, pp. 581-183 with English language translation.

Primary Examiner—James W. Moffitt
Attorney, Agent, or Firm—Lowe, Price, Leblanc, Becker & Shur

[57] ABSTRACT

An address counter (2) counts the clock pulses sequentially to provide a count value as an address signal to a coincidence detecting circuit (3) and decoder (4). The coincidence detecting circuit (3) compares delay data applied from a delay data generating circuit (8) with the address signal and applies a reset signal to the address counter (2) when they coincide with each other. The address counter (2) repeats sequentially the above-mentioned operation in response to the reset signal after the count of address is reset to a predetermined value. The decoder (4) specifies a memory cell comprised in a memory device for performing a reading and writing operation in response to the address signal. The data output circuit (6) and the data input circuit (5) perform the reading and writing operation sequentially to the specified memory cell in response to the control signal outputted from the control circuit (7). As a result, the input data previously written is read and outputted with a delay. Therefore, a delayed input data can be obtained as an output data.

9 Claims, 4 Drawing Sheets

| RECEIVED DATA | | | | | | | | | |
|---|---|---|---|---|---|---|---|---|---|
| DATA 4 | F4 | DATA 3 | F3 | DATA 2 | F2 | DATA 1 | F1 | DATA 0 |

VARIABLE DELAY CIRCUIT FOR DELAYING INPUT DATA

BACKGROUND OF THE INVENTION

1. Field of the Invention

The present invention relates to a variable delay circuit for delaying input data.

2. Description of the Prior Art

FIG. 1 is a block diagram showing a circuit for detecting a frame synchronization used in a communication system using a conventional variable shift register. Referring to FIG. 1A, reference numerals 11–13 each denote a variable shift register, reference numeral 14 denotes a frame synchronization detecting circuit for receiving input or output signals of the variable shift registers 11–13 and detecting a frame synchronization of signals, reference characters S1–S4 denote nodes showing inputs and outputs of each of the variable shift registers 11–13 and the frame synchronization detecting circuit, and reference numeral 15 denotes a bit length setting circuit for providing a delay time for each of the variable shift registers 11–13 and providing a bit length signal to each of the variable shift registers 11–13. In addition, the term "bit length" means the "length of a delay time" in this specification.

FIG. 1B shows received data received by the circuit shown in FIG. 1A. Reference characters DATA0–DATA4 denote data containing necessary information out of those received data and reference characters F1–F4 denote frame synchronization patterns required for detecting a frame synchronization.

An operation is now described. The received data shown in FIG. 1B received by the circuit shown in FIG. 1A is inputted from the node S4 to the variable shift register 13 and then outputted from this circuit through the variable shift register 12 and the variable shift register 11. By appropriately setting the bit length signal applied to the variable shift registers 11–13 in response to a time interval between the frame synchronization patterns F1–F4 involved in the received data, the received data can be delayed by the time interval between the frame synchronization patterns F1–F4 at each of the variable shift registers 11–13. Therefore, at a certain time, the frame synchronization patterns F1, F2, F3 and F4 can be simultaneously detected at the nodes S1, S2, S3 and S4, respectively, by the frame synchronization detecting circuit 14, consequently indicating that the received data has been received in proper synchronization.

FIG. 2 is a block diagram showing a circuit structure of a conventional variable shift register. Referring to FIG. 2, reference numeral 101 denotes a decoder for specifying a register corresponding to an amount of delay by inputting a selected signal of k bits, which corresponds to the bit length signal generating circuit in FIG. 1A, reference characters MUX2–MUXi($i \leq 2^k + 1$) denote multiplexers which pass an output of a register R1 when they are selected by the decoder 101 and pass an output of a left-hand register when they are not selected, reference characters R2, ..., Ri denote registers which latch outputs of the above-mentioned multiplexers MUX2, ..., MUXi and output them to right-hand multiplexers, reference character $\phi$ denotes a clock signal, reference character DI denotes input data, and reference character DO denotes output data.

The conventional variable register is structured as mentioned above and the decoder 101 receives a selecting signal and specifies one multiplexer out of $2^k$ multiplexers. When the i-th multiplexer MUXi is specified, only multiplexer MUXi passes the output of the register R1, while other multiplexers pass the outputs of respective left-hand registers. Consequently, the register Ri latches the output of the register R1 in synchronization with the clock signal $\phi$ and other registers latch the outputs of left-hand registers. When the next clock signal $\phi$ is entered, the register Ri-1 latches the data of the register Ri and the register Ri latches next data outputted from the register R1. By repeating the above-mentioned operation, the input data DI passes through the register R1 and the register Ri up to the register R2, so that a delay as much as (i+1) clocks is provided and consequently outputted as the output data DO.

Since the conventional shift register is structured as mentioned above, there were problems in which the number of delay stages is limited within the range determined by the number of provided registers. In addition, since the register is used as a memory device, there were other problems in which a large area need be occupied, memory capacity is small and power consumption is increased. Furthermore, there were other problems in which the circuit structure for setting an amount of delay became complicated when a large number of delay stages are required.

SUMMARY OF THE INVENTION

Therefore, a main object of the present invention is to provide a circuit in which the limit of the required delay time is moderated, a greater memory capacity can be obtained and power consumption is decreased.

Briefly, the present invention comprises memory cell specifying means connected to memory device means comprising a memory cell array storing input data and to means for generating delay data and responsive to a clock signal for applying a signal which specifies a memory cell as a function of the delay data to the memory device means; data input means connected to means for receiving the input data from outside and to the memory device means and responsive to a control signal generated from control means in response to a clock signal for writing the input data to a memory cell comprised in the memory device means and specified by the memory cell specifying means; and data output means connected to memory device means and responsive to the control signal for reading the input data written in a memory cell specified by the memory cell specifying means and outputting the same, the control means being adapted to control an operation timing so as to perform the writing operation by the data input means after the reading operation by data output means to the specified memory cell.

According to the present invention, memory cell specifying means applies to the memory device means a signal for specifying a memory cell to which the data output means and data input means perform a reading operation and writing operation as a function of delay data generated from delay data generating means. The memory device means is responsive to the signal for specifying a memory cell to perform a reading and outputting operation of old input data already written and writing operation of new input data from input data receive means by means of the data output means and data input means. By repeating the above-mentioned operation, delayed input data is outputted.

According to the present invention, since the memory device means comprises the memory-cell array, an advantage is brought about that more storage capacity can be obtained in a small occupied area. Other advantages are also brought about that limitations of the length of a delay time are enlarged and power consumption is decreased.

In a preferred embodiment of the present invention, the memory cell specifying means comprises coincidence detecting means connected to means for generating delay data and to address counter means responsive to the clock signal for counting address and outputting an address signal and responsive to the clock signal, for comparing the delay data with the address signal and applying to address counter means a reset signal for resetting the address counter means to the predetermined value; and decoder mean connected to the address counter means and responsive to the clock signal for decoding the address signal and applying the signal specifying a memory cell to the memory device means.

In the preferred embodiment of the present invention, the address counter means is responsive to the clock signal to count the address sequentially and to apply the address signal to the coincidence detecting means and decoder means. The coincidence detecting means is responsive to the clock signal to compare the delay data applied from the means for generating the delay data with the address signal and applies the reset signal to the address counter means when they coincide with each other. The address counter means is responsive to the reset signal to repeat the above-mentioned operation after the count of address is reset to the predetermined value. The address signal applied to the decoder means is decoded by the decode means and applied to the memory device means as a signal for the decoded address signal to specify a memory cell.

In the preferred embodiment of the present invention, an advantage is brought about that the memory cell specifying means without particular necessity of external control can be easily obtained by the address counter means, the decoder means and the coincidence detecting circuit of a simple structure.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figures 1A, 1B:
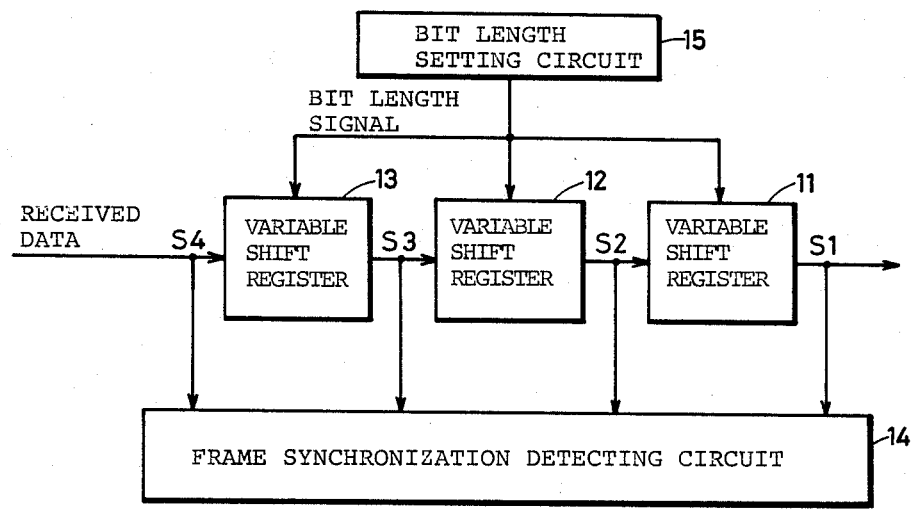
FIG. 1A is a block diagram showing a circuit for detecting a frame synchronization used in a communication system using the conventional variable shift register.
FIG. 1B is a diagram showing a schematic structure of received data for describing an operation of the circuit shown in FIG. 1A.
Figure 2:
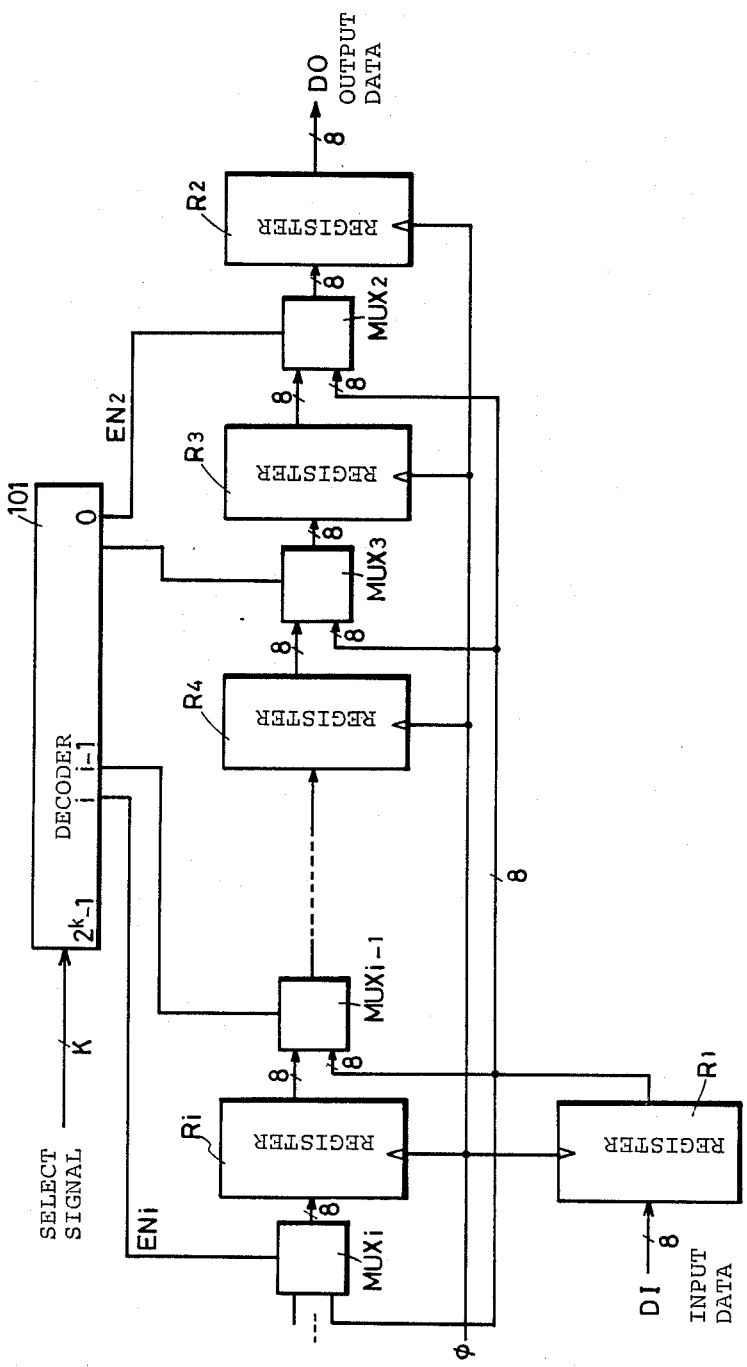
FIG. 2 is a block diagram showing a circuit structure of the conventional variable shift register.
Figure 3:
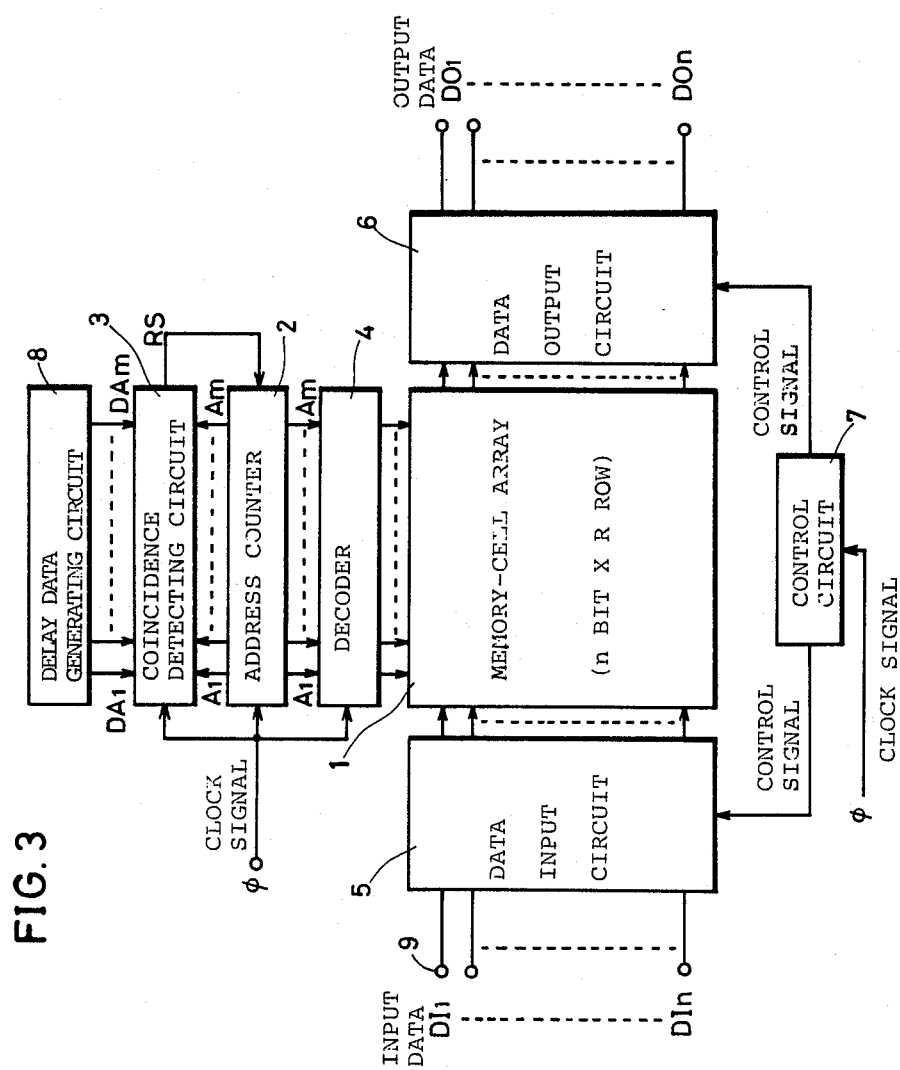
FIG. 3 is a block diagram showing one example of circuit structure of the variable delay circuit in accordance with the present invention.

Referring to the figures, one embodiment of the present invention is now described. Referring to FIG. 3, reference numeral 1 denotes a memory-cell array of n bits x R rows, reference numeral 2 denotes a row address counter operated by an external clock signal $\phi$ and capable of being reset, reference numeral 8 denotes a delay data generating circuit for generating delay binary data DA1–DAm of m bits specifying a delay time, reference numeral 3 denotes a coincidence detecting circuit for detecting the coincidence of the delay binary data DA1–DAm inputted from the delay data generating circuit 8 and outputs A1–Am of the address counter 2, reference numeral 4 denotes a decoder for selecting a row of the memory cell array 1, reference numeral 5 denotes data input circuit for receiving the data DI1–DIn and applying the same to the memory cell array 1 in response to a control signal, reference numeral 6 denotes a data output circuit for receiving data from the memory cell array 1 and outputting the same in response to a control signal, reference numeral 7 denotes a control circuit for generating a control signal for controlling a reading and writing operation of the memory cell array 1 by the data input circuit 5 and the data output circuit 6 in response to the clock signal $\phi$.

Figure 4:
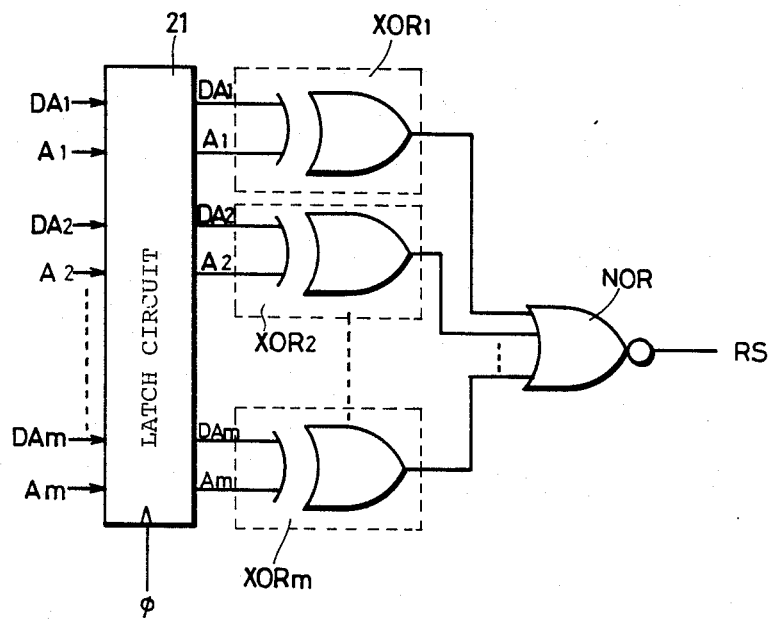
FIG. 4 is a block diagram showing one embodiment of the coincidence detecting circuit in accordance with the present invention.

FIG. 4 is an embodiment of the coincidence detecting circuit. Referring to FIG. 4, reference numeral 21 denotes a latch circuit for latching a delay binary data $DAi(1 \leq i \leq m)$ and the output Ai of the address counter 2 by the clock signal $\phi$, reference characters XOR1–XORm denote exclusive OR gates to which the delay binary data DAi held in the latch circuit 21 and the output Ai of the address counter 2 are inputted, reference character NOR denotes an NOR gate receiving the outputs of the XOR1–XORm as inputs and having m inputs, and reference character RS denotes an output of the NOR and a reset signal for resetting the address counter 2.

Now a description is made of an operation which occurs in the variable shift register structured as mentioned above when the value of the address counter 2 is reset to "0" and a delay of l stages from the delay data generating circuit 8 is set by the delay binary data DAi. Referring to FIG. 3, the data output circuit 6 reads a content of a row of the memory-cell array 1 corresponding to the address "0" in accordance with a command of the control circuit 7 and outputs the same to the output terminal DO1–DOn and then the data input circuit 5 overwrites the data DI1–DIn on the same row in a bit parallel fashion. The address counter 2 counts up on falling of the clock signal $\phi$ and the decoder 4 receives outputs A1–Am of the address counter 2 on rising of the clock signal $\phi$, performs decoding and specifies a particular count up row. In accordance with the control circuit 7, the data output circuit 6 and data input circuit 5 perform a reading operation and writing operation sequentially from and to the row of the memory array 1 specified by the decoder 4 from the value of the address counter 2. On rising of the (l −1)th clock, the decoder 4 latches the value of the address counter 2 corresponding to the (l−1) and the data output circuit 6 and the data input circuit 5 perform a data reading and writing operation from and to the (l−1l)th row. On falling of the (l−1)th clock $\phi$, the address counter 2 counts up. When an output value of the address counter 2 becomes a value corresponding to l, the delay binary data DA1-DAm coincide with outputs A1-Am of the address counter 2 in the coincidence detecting circuit 3. Therefore, the reset signal RS is generated from the coincidence detecting circuit 3 and applied to the address counter 2 and then the address counter 2 is reset. When the coincidence detecting circuit in FIG. 4 is used, for example, the m output signals of XOR1-XORm are all rendered to be low, with the result that on receiving those signals the NOR gate outputs the reset signal RS of high level and the address counter 2 is reset to the address "0".

On rising of the l-th clock $\phi$, the address "0" is latched to the decoder 4 and the data output circuit 6 and the data input circuit 5 reads the initial data written in the address "0", outputs the same to the DO1-DOm and then overwrites the next input data at the address "0".

By repeating the above-mentioned operation, a delay shift register of $l(l \leq 2^m)$ stages can be structured. The l is a value which is programmable and externally set by users. By applying the delay binary data DA1-DAm to the circuit, a shift register of any length ($\leq 2^m$) required by users can be structured.

The memory-cell array can perform the reading and writing operation asynchronously in a FAST IN FAST OUT type memory cell.

The operation also may be performed in a memory cell having a reading and writing bit line in common (such as a static memory cell, a dynamic cell comprising one transistor and one capacitor cell). In such case, the data output circuit 6 and the data input circuit 5 have access to the common bit line.

In the embodiment in FIG. 4, although the coincidence detecting circuit 3 is shown as comprising an exclusive OR element and an NOR element, the same operation can be implemented if the exclusive OR element and the NOR element may be replaced with an exclusive NOR element and an AND element, respectively.

In the above embodiment, although the memory-cell array is shown as comprising n bits x R rows, it may be structured as comprising n bits x R rows x J columns. In such case, the decoder 4 comprises a plurality number (R) of row decode means and a plurality (J) of column decode means, whereby more amount of data units can be used.

The above embodiment is structured so that the address counter may be reset after the coincidence of the delay binary data set by users and the output value of the address counter is detected by the coincidence detecting circuit 3. In such structure, however, there was a problem that it is sometimes late for the output of the address counter to be reset to "0" because a delay has been generated before the coincidence is detected and then a reset signal is outputted. In order to avoid this problem and attain high speed, the coincidence detecting circuit 3 plus an adder and a latch circuit may be used, thereby solving the above-mentioned problem.

Figure 5:
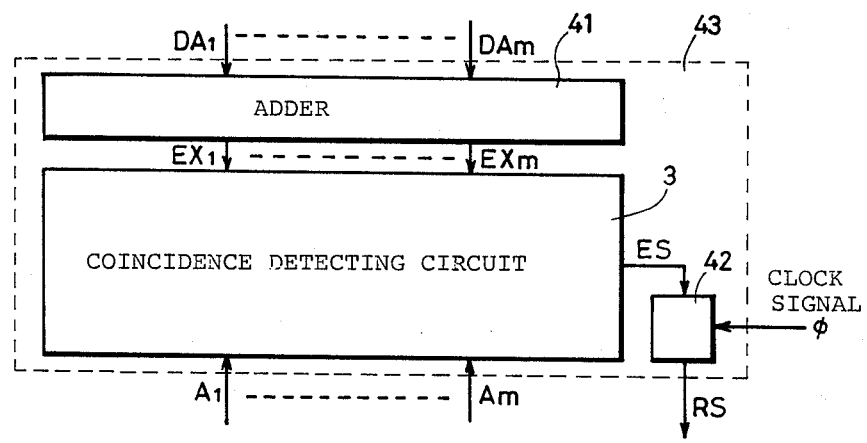
FIG. 5 is a block diagram showing another embodiment of the coincidence detecting circuit in accordance with the present invention.

FIG. 5 is a circuit block diagram showing a coincidence detecting circuit for preventing a delay of generation of the reset signal. Referring to FIG. 5, reference numeral 41 denotes a m-bit adder for subtracting 1 from the delay binary data DA1-DAm, reference numeral 3 denotes the same coincidence detecting circuit as the above embodiment, reference numeral 42 denotes a latch circuit for holding for one clock time a coincidence signal ES outputted from the coincidence circuit 3 when the coincidence is detected and then outputting the same as a reset signal RS, and reference numeral 43 denotes the coincidence detecting circuit for preventing a delay of generation of the reset signal. In the coincidence detecting circuit for preventing a delay of generation of the result signal, when a delay of l stages is set by the binary data DAi and the output A1-Am of the address counter is at the address corresponding to $(l-1)$, the coincidence detecting circuit outputs the coincidence signal ES. The coincidence signal ES is latched by the latch circuit, outputs the reset signal RS immediately after receiving the signal $\phi$, and then resets the content of the address counter 2 to "0". By using this circuit, the reset signal RS for resetting the address counter 2 is outputted to the address counter 2 immediately and, as a result, a reset operation of the address counter 2 can be prevented from being delayed.

As described in the above, a variable delay circuit in accordance with the present invention comprises a memory device means comprising a memory-cell array plus address counter means, decoder means and simple coincidence detecting means. Therefore, the circuit has advantageous features in that there is more storage capacity in a small occupied area, the limitation of the length of a delay time restricted by the memory capacity is enlarged and power consumption is small.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A variable delay circuit for delaying input data comprising:
   means for receiving input data externally;
   memory device means comprising a memory-cell array for storing the input data;
   control means for generating a control signal in response to a clock signal;
   data input means connected to said means for receiving input data and responsive to the control signal generated from said control means for writing the input data to the memory cell specified by a signal for specifying a memory cell in said memory device means;
   data output means responsive to the control signal generated from said control means for reading the input data written in the memory cell specified by a signal for specifying a memory cell in said memory device means and outputting the same, said control means being adapted to control an operation timing so that the writing operation of the input data may be performed by said data input means after the reading operation is performed to the specified memory cell in said data output means;
   means for generating delay data; and
   memory cell specifying means connected to said memory device means and said means for generating delay data and responsive to a clock signal, for applying to said memory device means the signal specifying a memory cell as a function of the delay data, wherein said memory cell specifying means comprises address counter means responsive to the clock signal for counting address and outputting an address signal; coincidence detecting means connected to said means for generating delay data and to said address counter means and responsive to the clock signal for comparing the delay data with the address signal and, when the coincidence is detected, applying to said address counter means a reset signal resetting said address counter means to the predetermined value; and decoder means connected to said address counter means and responsive to the clock signal for decoding the address signal and applying to said memory device means the signal specifying a memory cell.

2. A variable delay circuit in accordance with claim 1, wherein said coincidence detecting means comprises latch circuit means for receiving the delay data and the address signal and outputting latched delay data and latched address signal in response to the clock signal, comparing means connected to the outputs of said latch means for comparing the latched delay data with the latched address signal and outputting said reset signal when they coincide with each other.

3. A variable delay circuit in accordance with claim 2, wherein said comparing means comprises a first kind of a plurality of logic elements for comparing the latched delay data of a plurality of bits with the latched address signal of a plurality of bits at every corresponding bit and outputting coincidence signals when they coincide with each other; and a second kind of a logic element connected to the output of said first kind of a plurality of logic elements and outputting said reset signal when the coincidence signals are outputted from said first kind of all logic elements.

4. A variable delay circuit in accordance with claim 3, wherein said first kind comprises an exclusive OR gate and said second kind comprises an NOR.

5. A variable delay circuit in accordance with claim 3, wherein said first kind comprises an exclusive NOR and said second kind comprises an AND.

6. A variable delay circuit in accordance with claim 1, wherein said coincidence detecting means further comprises means connected to said means for generating delay data for adding the predetermined number to the delay data and applying reduced delay data to said coincidence detecting means as the delay data; and delay circuit means connected to said coincidence detecting means for receiving the advanced reset signal responsive to the reduced delay data outputted from said coincidence detecting means and outputting said reset signal in response to the clock signal after it is delayed by the clock signals corresponding to the same predetermined number.

7. A variable delay circuit in accordance with claim 2, wherein said variable delay circuit is used as a delay circuit for detecting a frame synchronization in a communication system.

8. A variable delay circuit for delaying the transmission of input data blocks received sequentially at uniform time intervals in accordance with a clock signal comprising:

memory device means comprising an array of memory cells in a matrix of rows and columns for storing the input data;

means for successively writing each received data block to different specified address locations in said memory device in response to said clock signal;

output means for reading out data blocks stored in said memory device;

delay setting means for establishing a time delay, equal to a selectable number of said intervals, to transpire for the readout of input data blocks by said output means;

means for setting the number of said different specified address locations for each received data block equal to the number of delay intervals set by said delay setting means; and means responsive to said clock signal for writing newly received data at the address locations of the last previously read data block address locations in said memory device.

9. A method for delaying the transmission of data blocks received sequentially at uniform time intervals comprising the steps of:

setting a time delay equal to a desired number of said time intervals during which the transmission of said data is to be delayed;

specifying address block locations, in a matrix of memory cells for storage of said data, equal in number to the number of time intervals of said delay;

successively writing each received data block to different specified address locations in said matrix at each interval; and reading out data stored at the address locations in said matrix immediately prior to rewriting newly received data therein.

* * * * *